United States Patent [19]

Ikegami et al.

[11] Patent Number: 4,517,266
[45] Date of Patent: May 14, 1985

[54] HOLOGRAPHIC RECORDING MATERIAL AND PROCESS FOR PRODUCING HOLOGRAMS

[75] Inventors: Kasumi Ikegami, Kokubunji; Hirofumi Okuyama, Sagamihara, both of Japan

[73] Assignee: Fujitsu Limited, Kawasaki, Japan

[21] Appl. No.: 458,850

[22] Filed: Jan. 18, 1983

[30] Foreign Application Priority Data

Jan. 18, 1982 [JP] Japan .................................. 57-5695

[51] Int. Cl.$^3$ ........................ G03C 1/70; G03C 9/08; G03H 1/04
[52] U.S. Cl. ......................................... 430/2; 430/1; 430/270; 430/926
[58] Field of Search ................. 430/2, 1, 270, 340, 430/296, 916, 923, 926

[56] References Cited

U.S. PATENT DOCUMENTS

| | | | |
|---|---|---|---|
| Re. 28,789 | 4/1976 | Chang | 430/271 X |
| 3,926,637 | 12/1975 | Bartolini et al. | 430/2 |
| 3,951,663 | 4/1976 | Ross | 430/2 |
| 3,963,490 | 6/1976 | Graube | 430/2 |
| 4,055,423 | 10/1977 | Bartolini | 430/1 |
| 4,139,853 | 2/1979 | Ghekiere et al. | 346/76 L |
| 4,172,724 | 10/1979 | Matsumoto et al. | 430/1 |
| 4,348,472 | 9/1982 | Jagt | 430/270 X |

FOREIGN PATENT DOCUMENTS

| | | | |
|---|---|---|---|
| 2451714 | 5/1976 | Fed. Rep. of Germany | 430/2 |
| 2733703 | 2/1978 | Fed. Rep. of Germany | . |
| 2902883 | 8/1979 | Fed. Rep. of Germany | . |
| 58-54373 | 3/1983 | Japan | 430/2 |

OTHER PUBLICATIONS

Bjorklund et al., "A Holographic Technique for Investigating Photochemical Reactions", Journal of Chemical Physics, vol. 73, No. 9, Nov. 1980, pp. 4321-4328.

Primary Examiner—John E. Kittle
Assistant Examiner—Cynthia Hamilton
Attorney, Agent, or Firm—Staas & Halsey

[57] ABSTRACT

A holographic recording material comprising a polymer containing vinylcarbazole rings, a cyclic cis-α-dicarbonyl compound capable of forming a radical by light irradiation and a dye as a photosensitizer or a spectral sensitizer. A hologram can be obtained by exposing the holographic recording material to an interference pattern of a radiation to form a holographic interference pattern, subjecting the material to a swelling treatment in a first medium, and then subjecting the material to a contraction treatment in a second medium.

4 Claims, 7 Drawing Figures

HOLOGRAPHIC RECORDING MATERIAL AND PROCESS FOR PRODUCING HOLOGRAMS

BACKGROUND OF THE INVENTION

The invention relates to holography. Particularly, the invention relates to a holographic recording sensitive material in which the crosslinking reaction of a polymer is to be utilized and to a process for producing holograms with the use of such a sensitive material.

Briefly described, holography is a technique for reproducing a wave front from an object by recording the wavefront with a recording material such as a photographic sensitive material, while irradiating the recorded material with light. A hologram is the recording in the material, produced by the interference of a light wave from an object with another light wave interfering therewith. As practically utilizable holographic recording materials, there have been known photographic sensitive materials such as silver salts as well as many materials such as gelatin bichromate and thermoplastics. These known holographic recording materials do not always have all of the desired properties as mentioned below and have a poor workability. The desired properties of the holographic recording materials may be, for example, (1) high definition, (2) high sensitivity, (3) good resistance to moist heat, (4) good resistance to light, and (5) ease in recording and reproduction.

As materials satisfying the requirements as mentioned above, there have recently been proposed polyvinylcarbazole holographic recording materials in which the high sensitivity of an organic halogen compound is to be utilized (see, for example, Japanese Unexamined Patent Publication (Kokai) Nos. 53-15153, 54-101343 and 54-102140). These materials may utilize a crosslinking reaction and employ a halogen-containing compound as a crosslinking agent. Although the materials of this type are excellent in definition, sensitivity, and resistance to environment such as resistance to moist heat and resistance to light, they have drawbacks in that they are insensitive to light of long wavelengths or have a poor durability. This is because the sensitive wavelengths of the materials depend on the sensitive wavelengths of the employed halogen-containing compounds and, thus, it is difficult to sensitize the materials.

SUMMARY OF THE INVENTION

It is the primary object of the present invention to provide a halographic recording sensitive material which is sensitive to light of broad wavelength range including long wavelengths and has improved sensitivity, definition, resistance to moist heat and resistance to light.

The inventors have made extensive studies for attaining the above-mentioned object and found that a desirably sensitive material can be provided using a vinylcarbazole polymer containing carbazolyl rings together with a cyclic cis-α-dicarbonyl compound capable of forming a radical by light irradiation and a dye as a photosensitizer or a spectral sensitizer.

According to the present invention, there is also provided a process for producing a hologram, which comprises exposing a sensitive material comprising a vinylcarbazole polymer containing carbazolyl rings, a cyclic cis-α-dicarbonyl compound capable of forming a radical by light irradiation and a dye as a photosensitizer or a spectral sensitizer to an interference pattern of a radiation to form a holographic interference pattern, subjecting the sensitive material having the formed holographic pattern to a swelling treatment in a first medium in which the material is insoluble but which causes the material to swell, and then subjecting the material to a contraction treatment in a second medium which is not a solvent of the material.

DESCRIPTION OF THE PREFERRED EMBODIMENTS

The present invention utilizes a crosslinking reaction of the vinylcarbazole polymer owing to the dehydrogenation of the carbazolyl rings by a radical derived from the cyclic cis-α-dicarbonyl compound on light irradiation, as represented by the following reaction formula,

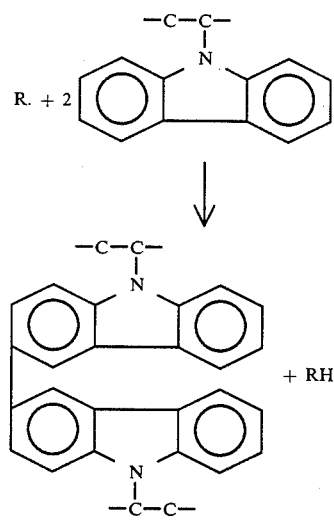

This crosslinking reaction results in a difference in solvent resistance between the exposed areas and the unexposed areas in the material. Thus, a hologram is obtained by treating the exposed material with a solvent so as to form a relief pattern. The cyclic cis-α-dicarbonyl compounds absorb radiations in the visible region and generate a radical through an excited triplet state. Therefore, the compounds may be sensitized by triplet sensitization or spectrally sensitized using various dyes.

When the holographic recording material of the present invention is exposed to light, the exposed areas acquire a higher solvent resistance than the unexposed areas. Then, when the exposed material is subjected to solvent treatment, the unexposed areas are selectively dissolved, whereby a relief pattern is formed in the material. The mechanism by which a relief pattern is formed may be considered as follows. In the exposed area, carbonyl radicals generated due to the light irradiation cause the dehydrogenation at the 3- or 6-position of the carbazolyl rings contained in the vinylcarbazole polymer, so as to cause the crosslinking of the carbazolyl rings, thereby increasing the molecular weight of the polymer. This molecular weight increase results in an increase in the refractive index and solvent resistance of the polymer. Thus, when the exposed material is subjected to solvent treatment, the unexposed areas are converted into a swollen or partially dissolved state. Then, when the material is brought into contact with a non-solvent, the swollen or partially dissolved areas contract, whereby a relief pattern is formed in the material.

Further, since the cyclic cis-α-dicarbonyl compounds generate a radical through an excited triplet state, they can be increased in sensitivity and the photosensitive wavelength region can be increased by the use of various sensitizers having an excited electronic energy level capable of causing triplet sensitization.

It has been found that thioflavines are particularly advantageously employed as the sensitizing dye and, thus, provide high sensitive holographic recording materials. It is considered that the remarkable sensitizing effect of the Thioflavines results from the fact that they have a high probability of transition between the singlet state and the triplet state and their energy levels in the triplet state are very close. Thus, light energy absorbed by Thioflavine remarkably accelerates the radical reaction of 2,3-bornanedione through the triplet state energy level so as to contribute to the crosslinking reaction of the vinylcarbazole polymer, i.e., the holographic recording.

Figure 1:
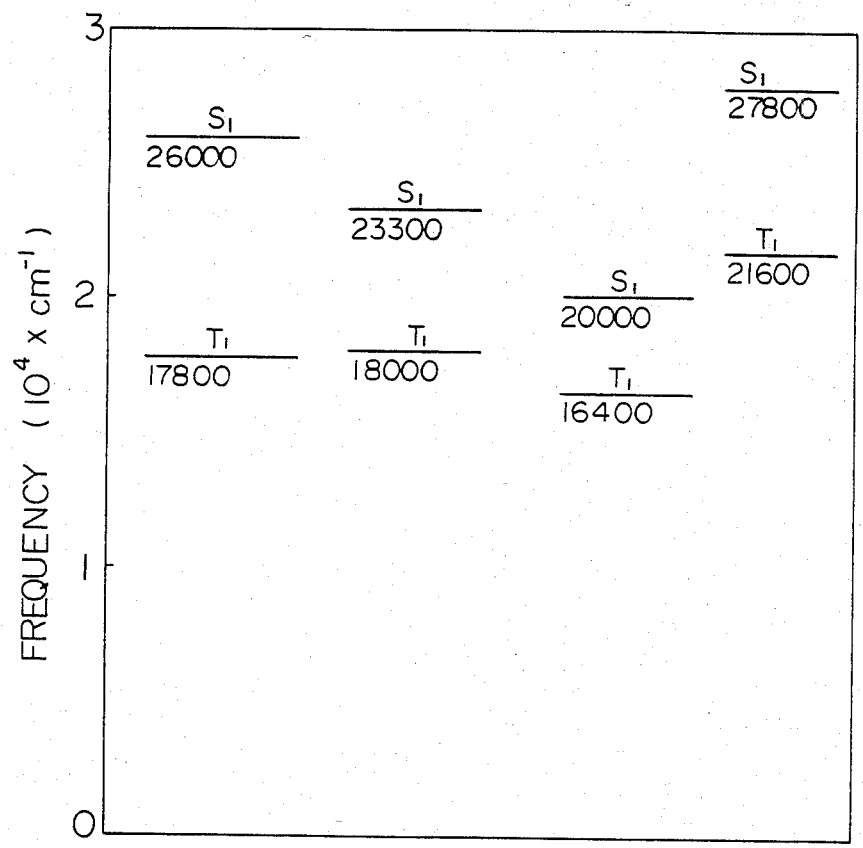
FIG. 1 illustrates the energy levels of 2,3-bornanedione, Thioflavine, Acridine Orange and Michler's ketone.

FIG. 1 illustrates the energy levels of the singlet state ($S_1$) and triplet state ($T_1$) of 2,3-bornanedione which is a cyclic cis-α-dicarbonyl compound and the energy levels of the singlet state ($S_1$) and triplet state ($T_1$) of each of Thioflavine, Acridine Orange and Michler's ketone which are sensitizing dyes. The sensitizing dyes are excited from the singlet ground state ($S_0$) to the excited singlet state ($S_1$) by exciting light, e.g., from an Ar-laser, and then relaxed to the triplet state ($T_1$) by a non-radiating transition. Since the triplet state is an excited state of a relatively long life, it becomes possible that molecules excited to the triplet state exist for a certain period of time in a fair concentration, when instantaneously excited by a large volume of light. The triplet state energy level ($T_1$) of 2,3-bornanedione is 17,800 $cm^{-1}$, while $T_1$ of Thioflavine is 18,000 $cm^{-1}$, $T_1$ of Michler's ketone is 21,600 $cm^{-1}$, and $T_1$ of Acridine Orange is 16,400 $cm^{-1}$.

In order for the triplet state energy of a sensitizing dye to give energy, to a cyclic cis-α-dicarbonyl compound, in sufficient amount to generate a radical, it is necessary that the following relationships are satisfied:
$S_1$ (cyclic cis-α-dicarbonyl compound) > $S_1$ (sensitizing dye)
$T_1$ (sensitizing dye) ≧ $T_1$ (cyclic cis-α-dicarbonyl compound)

The vinylcarbazole polymer usable for the present invention may be substituted by a substituent such as halogen, alkyl, amino, nitro or thiocyano. Copolymers of vinylcarbazole with comonomers may also be usable.

The cyclic cis-α-dicarbonyl compounds usable for the present invention may include 2,3-bornanedione, 2,2,5,5-tetramethyl-tetrahydro-3,4-furandione, parabanic acid (imidazoletrione), indole-2,3-dione (isatin), 1,1,4,4-tetramethyltetralin-2,3-dione and 3-methyl-1,2-cyclopentanedione.

The sensitizing dyes usable for the present invention may include Thioflavines as well as bis(p-aminophenyl-α,β-unsaturated) ketones, bis(alkylamino)acridine dyes, cyanine dyes, styryl dye bases and p-aminophenyl ketones.

The holographic recording sensitive material according to the present invention may be prepared by dissolving or dispersing the above-mentioned components, i.e., the polymer, crosslinking agent and sensitizer in an appropriate solvent at a desired concentration, and then spreading the obtained solution or dispersion into a thin film or coating it onto a substrate such as of glass or plastic. Advantageously, the amount of the crosslinking agent used may be 0.5% to 50%, preferably 1% to 5%, by weight based on the weight of the polymer, and the amount of the sensitizer used may be 0.1% to 50%, preferably 0.5% to 10%, by weight based on the weight of the polymer. If necessary, other additives such as plasticizers, reducers and antioxidants may also be added to the solution or dispersion.

Figure 2:
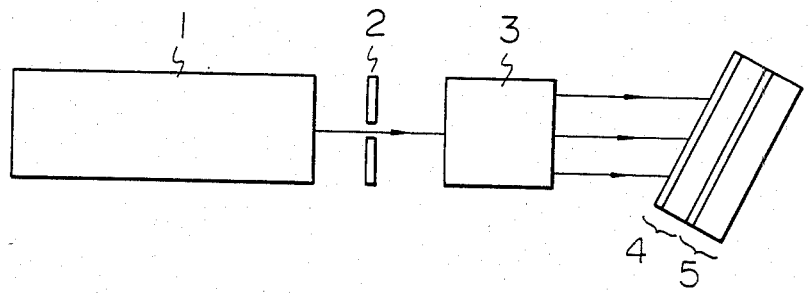
FIG. 2 is a schematic view of a holographic copying optical system.

Holographic recording may be carried out, using the holographic recording sensitive material according to the present invention, on a holographic copying optical system as illustrated in FIG. 2, for example. In the illustrated optical system, the laser beam from a laser 1 passes through a shutter 2 and then a collimater lens 3 to record a hologram onto a sensitive plate 5 after being irradiated onto a master 4.

According to the present invention, there can be efficiently obtained with a high reproducibility a hologram having a high diffraction efficiency and a high definition as well as an excellent resistance to environment.

The present invention will further be illustrated by the following examples to which the present invention is not limited.

EXAMPLE 1

Figure 3A:
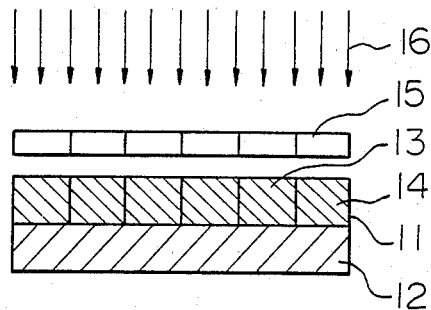
FIGS. 3A to C schematically illustrate a holographic copying process.
Figure 3B:
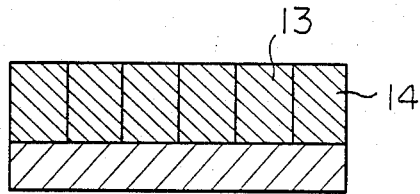
Figure 3C:
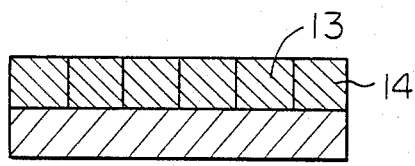

A photosensitive solution having the following composition:
1 g of polyvinylcarbazole (Tuvicol 210, manufactured by Anan Sangyo K.K., molecular weight: 560,000),
0.025 g of 2,3-bornanedione,
0.01 g of Thioflavine, and
10 g of chloroform,
was coated on a glass plate measuring 70 mm × 70 mm × 1 mm in the dark by a spin coating method in such a manner that the coated layer after drying had a thickness of 4 μm. Then, the coated layer on the glass plate was dried in an oven at a temperature of 60° C. for 15 minutes to form a holographic recording sensitive plate. The sensitive plate was subjected to holographic recording using a holographic copying optical system with an argon laser (488 nm) as shown in FIG. 2, then developed in toluene vapor in the process as shown in FIGS. 3A–C, subjected to dipping treatment in n-pentane, and finally dried to form a hologram. FIG. 3A shows the light exposure step, FIG. 3B the swelling step, and FIG. 3C the contracting step. 11 denotes the sensitive layer, 12 denotes a support (glass plate), 13 denotes exposed area, 14 denoted unexposed area, 15 denotes a holographic master, and 16 denotes laser beam. The space frequency was 1,000 lines/mm and the diffraction efficiency was 75%. The volume of the exposed light was 400 mJ/$cm^2$.

The hologram was left in an air-conditioned bath having a temperature of 60° C. and a relative humidity of 95%, in order to examine the moisture resistance thereof. Even after 10 days, no change in the diffraction efficiency and in the Bragg angle was observed.

Then the hologram was irradiated with an argon laser (wavelength: 488 nm, light intensity: 28 W/cm$^2$) for 10 hours in order to examine the light resistance thereof. No change was observed. Also, the hologram was irradiated with a radiation from a superhigh pressure mercury lamp (intensity in the region of 365 nm: 20 mW/cm$^2$). After about 3 hours, the hologram assumed a yellow color and the diffraction efficiency was decreased by about 1%. When the irradiation was further continued, no additional change in the diffraction efficiency was observed and even after the lapse of a period of 10 hours, the diffraction efficiency remained unchanged.

It was confirmed from the above-mentioned procedure that the hologram formed in this example had excellent resistance to moist heat and to light.

EXAMPLES 2 through 4

In order to investigate the relationship between the thickness of a holographic recording sensitive layer and the diffraction efficiency of the resultant hologram, three types of holograms were formed according to the same procedure as described in Example 1, except that the thickness of the photosensitive layer was changed to 2, 6 or 8 μm. The resultant data of the diffraction efficiency of the holograms are shown in Table 1 below.

TABLE 1

| Ex. No. | Thickness of layer (μm) | Diffraction efficiency (%) |
| --- | --- | --- |
| 1 | 4 | 75 |
| 2 | 2 | 50 |
| 3 | 6 | 85 |
| 4 | 8 | 92 |

EXAMPLE 5

A photosensitive solution having the following composition:
1 g of polyvinylcarbazole (Tuvicol 210),
0.02 g of 2,3-bornanedione,
0.02 g of Michler's ketone,
5 g of tetrahydrofuran, and
5 g of monochlorobenzene,
was spin coated on a glass plate measuring 70 mm×70 mm ×1 mm in a manner similar to that described in Example 1. The coated layer on the glass plate was heat dried at a temperature of 60° C. for 15 minutes to obtain a holographic recording sensitive plate.

Figure 4:
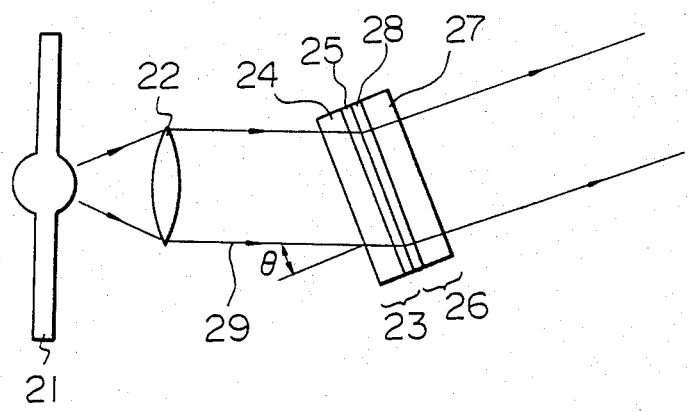
FIG. 4 is a schematic view of another holographic copying optical system.

A holographic copy was formed using this sensitive plate on an optical system shown in FIG. 4. The master 23 comprised a photographic plate 24 on which an amplitude hologram 25 was formed using a plane wave having a crossing angle of 60° (light source being He-Ne laser). A superhigh pressure mercury lamp 21 (USH-250D, manufactured by Ushio Denki K.K.) was used as the source of copy light. Light from the copy light source was converted to parallel light (i.e. copy light 29) through a lens 22, which copy light 29 was transmitted to the master 23 at a Bragg angle of θ. The exposure time was 2 minutes. A holographic recording sensitive plate 26 comprised a glass plate 27 on which a photosensitive layer 28 was formed, as described above. After exposure, the plate was developed in the vapor of a toluene/xylene mixture as described in Example 1, immersed in n-pentane, and dried in air to obtain a copy hologram. The resultant hologram was uniform all over the surface. The diffraction efficiency of the hologram was 53% and the thickness of the photosensitive layer was 2.5 μm.

EXAMPLES 6 and 7

A hologram was formed by the procedure as described in Example 1, except that Michler's ketone or Acridine Orange was used instead of Thioflavine. The resultant diffraction efficiency is shown in Table 2 below.

TABLE 2

| Ex. No. | Sensitizer | Diffraction efficiency (%) |
| --- | --- | --- |
| 6 | Michler's ketone | 5 |
| 7 | Acridine Orange | 5 |

Figure 5:
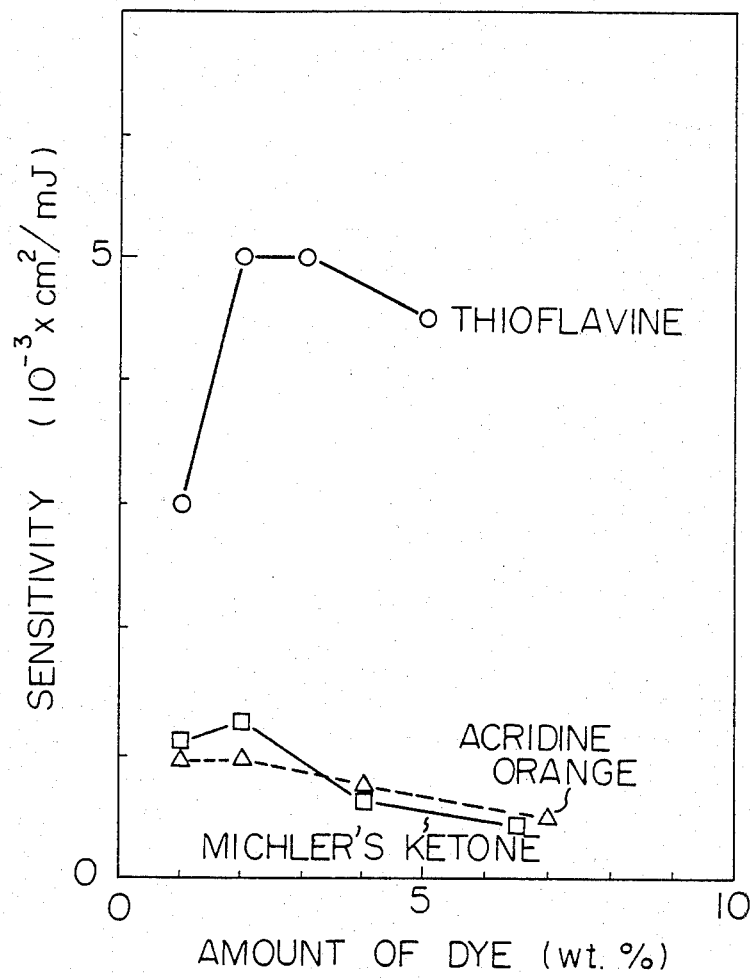
FIG. 5 is a graph showing the relationship between the sensitivity and amount of dye used in a holographic recording material.

The above-mentioned procedure was repeated by changing the amount of Thioflavine, Michler's ketone or Acridine Orange. The resultant sensitivity was as shown in FIG. 5. The sensitivity is represented in terms of an exposed light energy necessary to obtain a diffraction efficiency of 50%.

We claim:
1. A holographic recording material comprising a vinylcarbazole polymer containing carbazolyl rings, a cyclic cis-α-dicarbonyl compound capable of forming a radical by light irradiation and Thioflavine as a photosensitizer or a spectral sensitizer.

2. A holographic recording material as claimed in claim 1, wherein the Thioflavine dye and the cyclic cis-α-dicarbonyl compound satisfy the following relationships:

$S_1$ (cyclic cis-α-dicarbonyl compound)>$S_1$ (sensitizing dye)

$T_1$ (sensitizing dye)≧$T_1$ (cyclic cis-α-dicarbonyl compound)

in which $S_1$ represents the energy level of the respective excited singlet state and $T_1$ represents the energy level of the respective triplet state.

3. A holographic recording material as claimed in claim 1, wherein the cyclic cis-α-dicarbonyl compound is 2,3-bornanedione.

4. A process for producing a hologram, which comprises exposing a sensitive material comprising a vinylcarbazole polymer containing carbazolyl rings, a cyclic cis-α-dicarbonyl compound capable of forming a radical by light irradiation and Thioflavine as a photosensitizer or a spectral sensitizer to an interference pattern of a radiation to form a holographic interference pattern, subjecting the sensitive material having the formed holographic pattern to a swelling treatment in a first medium in which the material is insoluble but which causes said material to swell, and then subjecting the material to a contraction treatment in a second medium which is not a solvent of said material but which causes said material to contract.

* * * * *

UNITED STATES PATENT AND TRADEMARK OFFICE
CERTIFICATE OF CORRECTION

PATENT NO. : 4,517,266
DATED : May 14, 1985
INVENTOR(S) : Kasumi Ikegami et al

It is certified that error appears in the above-identified patent and that said Letters Patent is hereby corrected as shown below:

```
    Column 2, line 34, "R." should be --R·--.

Column 3, line 22 "thioflavines" should be
--Thioflavines--.

Column 4, line 64, denoted" should be --denotes--.

Column 6, line 39, delete "dye";
             line 42, "(sensitiz-" should be
--(Thioflavine)--;
             line 43, delete "ing dye";
             line 44, "sensitizing dye" should be
--Thioflavine--.
```

Signed and Sealed this

Seventh Day of January 1986

[SEAL]

Attest:

DONALD J. QUIGG

Attesting Officer

Commissioner of Patents and Trademarks